(12) United States Patent
He et al.

(10) Patent No.: US 7,701,015 B2
(45) Date of Patent: Apr. 20, 2010

(54) BIPOLAR AND CMOS INTEGRATION WITH REDUCED CONTACT HEIGHT

(75) Inventors: Zhong-Xiang He, Essex Junction, VT (US); Bradley A. Orner, Cambridge, VT (US); Vidhya Ramachandran, Ossining, NY (US); Alvin J. Joseph, Williston, VT (US); Stephen A. St. Onge, Colchester, VT (US); Ping-Chuan Wang, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 308 days.

(21) Appl. No.: 10/596,573

(22) PCT Filed: Dec. 16, 2003

(86) PCT No.: PCT/US03/40003

§ 371 (c)(1),
(2), (4) Date: Oct. 14, 2008

(87) PCT Pub. No.: WO2005/062380

PCT Pub. Date: Jul. 7, 2005

(65) Prior Publication Data

US 2009/0039522 A1     Feb. 12, 2009

(51) Int. Cl.
*H01L 29/72* (2006.01)
(52) U.S. Cl. ............... 257/370; 257/378; 257/E27.109
(58) Field of Classification Search .......... 257/370, 257/378, 758, 774, 775, 776, E27.109, E29.221, 257/E25.01, E25.011, E25.014, E25.016, 257/E25.024, E25.026, E23.145
See application file for complete search history.

(56) References Cited

U.S. PATENT DOCUMENTS

| 4,933,297 | A | 6/1990 | Lu |
| 5,563,433 | A | 10/1996 | Nagata et al. |
| 5,714,793 | A | 2/1998 | Cartagena et al. |
| 6,157,068 | A | 12/2000 | Hashimoto et al. |
| 6,399,993 | B1* | 6/2002 | Ohnishi et al. ............. 257/370 |
| 2002/0050627 | A1 | 5/2002 | Zambrano |
| 2002/0104995 | A1 | 8/2002 | Yamazaki et al. |
| 2004/0021222 | A1* | 2/2004 | Mori ......................... 257/758 |

FOREIGN PATENT DOCUMENTS

DE           10142690 A1      3/2003

OTHER PUBLICATIONS

Hafizi M: "New Submicron HBT IC Technology Demonstrates Ultra-Fast, Low-Power Integrated Circuits"—IEEE Transactions on Electron Devices, IEEE Service Center, Piscataway, NJ, US, vol. 45, No. 9, Sep. 1998, pp. 1862-1868.

* cited by examiner

*Primary Examiner*—Minh-Loan T Tran
*Assistant Examiner*—Vongsavanh Sengdara
(74) *Attorney, Agent, or Firm*—Wenjie Li

(57) ABSTRACT

Disclosed is a method and structure for an integrated circuit structure that includes a plurality of complementary metal oxide semiconductor (CMOS) transistors and a plurality of vertical bipolar transistors positioned on a single substrate. The vertical bipolar transistors are taller devices than the CMOS transistors. In this structure, a passivating layer is positioned above the substrate, and between the vertical bipolar transistors and the CMOS transistors. A wiring layer is above the passivating layer. The vertical bipolar transistors are in direct contact with the wiring layer and the CMOS transistors are connected to the wiring layer by contacts extending through the passivating layer.

8 Claims, 4 Drawing Sheets

BIPOLAR AND CMOS INTEGRATION WITH REDUCED CONTACT HEIGHT

BACKGROUND OF THE INVENTION

1. Field of the Invention

The present invention generally relates to integrated circuit structures that include multiple height devices and more particularly to an improved structure that reduces the height of the passivating layer to reduce the height of the contacts made to such devices.

2. Description of the Related Art

Fabrication of BiCMOS chips (integrated circuit chips having both bipolar transistors and complementary metal oxide semiconductor (CMOS) transistors) requires process integration of both bipolar and CMOS field effect transistors (FET) devices. One of the key challenges in process integration is to make contact connections to the differently sized devices. Reliable contact connection has always been one of the significant issues for base CMOS FET fabrication. Due to the significant vertical height difference between bipolar and CMOS FET devices, contact formation becomes even more difficult for BiCMOS chip fabrication. At present, the aspect ratio of contacts for BiCMOS is about 30% higher than base CMOS for 0.25 and 0.18 um SiGe technologies. This aspect ratio difference becomes unsustainable for future SiGe technologies (e.g., 0.13 um or below). The present invention described below provides a reliable solution to contact formation for future BiCMOS technologies.

SUMMARY OF THE INVENTION

The invention provides a method of forming different devices on a substrate. More specifically, the invention forms a plurality of complementary metal oxide semiconductor (CMOS) transistors and vertical bipolar transistors on the substrate. Note that the vertical bipolar transistors are taller than the CMOS transistors. The invention deposits a passivating layer over the bipolar transistors and the CMOS transistors and then removes a portion of the passivating layer so as to expose the vertical bipolar transistors and leave the CMOS transistors covered by the passivating layer. Next, the invention forms contacts to the CMOS transistors through the passivating layer and forms a wiring layer above the passivating layer such that the wiring layer is in direct contact with the vertical bipolar transistors.

Prior to forming the wiring layer the invention can form emitter contacts above the vertical bipolar transistors. These emitter contacts are actually positioned within the wiring layer, and can be made of a different material than the wiring within the wiring layer. The invention can also form a via layer above the wiring layer. The emitter contacts will extend through the wiring layer to the via layer. This process also forms base and collector contacts to the vertical bipolar transistors.

The inventive processing produces an integrated circuit structure that includes a plurality of complementary metal oxide semiconductor (CMOS) transistors and a plurality of vertical bipolar transistors positioned on a single substrate. The vertical bipolar transistors are taller devices than the CMOS transistors and can extend more than twice as far above the substrate as the CMOS transistors. In this structure, a passivating layer is positioned above the substrate and between the vertical bipolar transistors and the CMOS transistors. A wiring layer is above the passivating layer. The vertical bipolar transistors are in direct contact with the wiring layer and the CMOS transistors are connected to the wiring layer by contacts extending through the passivating layer.

There is also a via layer above the wiring layer and the vertical bipolar transistors emitter contacts are directly connected to the via layer. The emitter contacts extend through the wiring layer to the via layer. Thus, the emitter contacts are positioned within the wiring layer and can comprise a different material than the wiring within the wiring layer. Base and collector contacts connecting base and contact regions of the vertical bipolar transistors to the wiring layer extend through the passivating layer.

The invention polishes the BPSG very close to the top of bipolar device to decrease the contact opening aspect ratio and correspondingly decrease contact defect rates. The invention uses a wider emitter contact for the bipolar devices. Thus, the invention provides easier contact connection integration (more reliable contacts and better yield) and faster bipolar transistors with reduced lateral dimension.

These, and other, aspects and objects of the present invention will be better appreciated and understood when considered in conjunction with the following description and the accompanying drawings. It should be understood, however, that the following description, while indicating preferred embodiments of the present invention and numerous specific details thereof, is given by way of illustration and not of limitation. Many changes and modifications may be made within the scope of the present invention without departing from the spirit thereof, and the invention includes all such modifications.

BRIEF DESCRIPTION OF THE DRAWINGS

The invention will be better understood from the following detailed description with reference to the drawings, in which.

DETAILED DESCRIPTION OF PREFERRED EMBODIMENTS OF THE INVENTION

Figure 1:
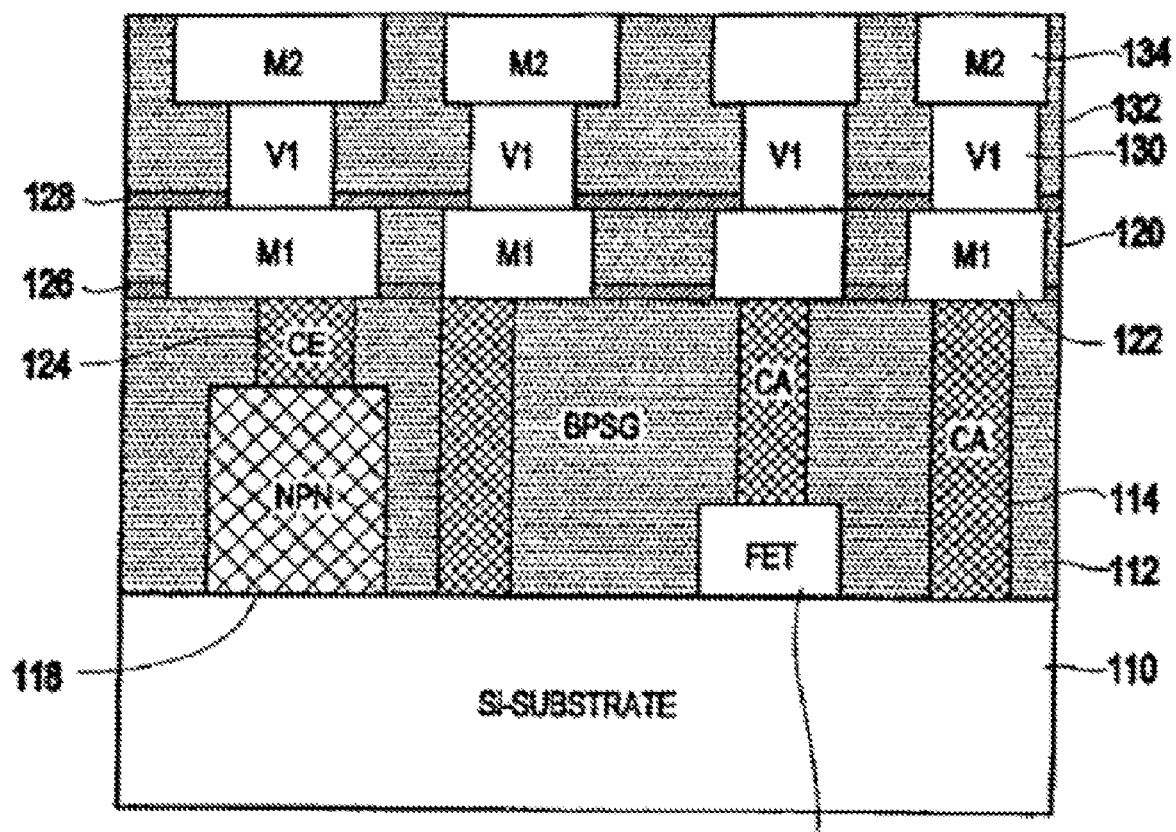
FIG. 1 is a schematic diagram of structure that includes multiple devices having different heights.

The present invention and the various features and advantageous details thereof are explained more fully with reference to the nonlimiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the present invention. The examples used herein are intended merely to facilitate an understanding of ways in which the invention may be practiced and to further enable those of skill in the art to practice the invention. Accordingly, the examples should not be construed as limiting the scope of the invention.

FIG. 1 illustrates an integrated circuit that includes multiple devices 116, 118 that have different heights. In the examples used herein, the devices include a CMOS transistor 116 and a vertical bipolar transistor 118. However, the invention is not limited to these specific devices and these devices are selected in these examples merely to illustrate the operation of the invention. Therefore, the invention is equally applicable to any integrated circuit structure that incorporates devices of different sizes into its design. For example, the invention is equally applicable to any combination of a horizontal device and a vertical device or differently sized horizontal and/or vertical devices. The invention can be used with bipolar transistors, varactors, diodes, field effect transistors, resistors, capacitors, etc. Moreover, the present invention can also be applied to the formation of FET contacts such as gate and source or drains should the topography difference between FET contacts become a severe constraint to manufacturing fabrication.

In FIG. 1, item 110 represents a substrate such as a silicon substrate upon which the devices 116, 118 are formed. Item 112 illustrates an insulator passivation layer that could be formed from, for example, Boron Phosphor doped Silicate Glass (BPSG) or other similar substance. Items 114 illustrate various contacts (e.g., polysilicon, metal, alloy, etc.) that are made through the passivation layer 112. Item 120 represents a wiring layer with various first metal layer (M1) wires 122. The emitter contact of the vertical bipolar transistor 118 is shown as item 124 in FIG. 1. Item 126 represents an insulator that separates the wiring layer 120 from the passivating layer 112. A via/wiring layer 132 includes first level vias (V1) 130 and additional second metal layer (M2) wires 134. Item 128 represents an insulator that separates the first metal layer 120 from the second metal/via layer 132.

Figure 6:
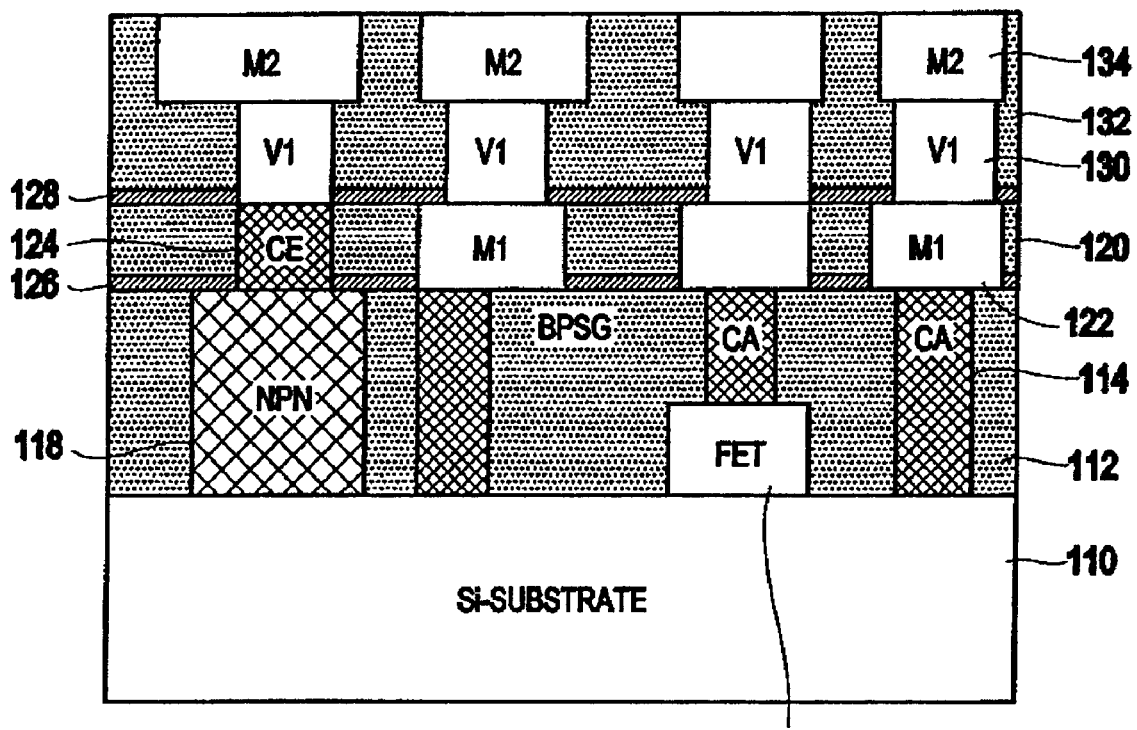
FIG. 6 is a schematic diagram of structure that includes multiple devices having different heights.

The structure shown in FIG. 6 is different than that shown in FIG. 1 in that, in the structure shown in FIG. 6, the emitter contact 124 is positioned within the wiring layer 120 instead of below the wiring layer 120 (as in the structure shown in FIG. 1). This allows the passivating layer 112 to be shorter in FIG. 6 than in FIG. 1 which, in turn, decreases the aspect ratio of the remaining contacts 114, thereby substantially reducing the defect rate of the contacts 114. In addition, the width of the emitter contact 124 can be made larger with the structure shown in FIG. 6 because the emitter contact is formed using a dedicated mask exclusive to the emitter contact. By making the emitter contact wider the margin of positioning error is made greater and the width of emitter itself can be fabricated narrower. In other words, by making the emitter contact wider, the possibility of defects resulting from misalignment of the emitter and its contact decreases. This allows the emitter to be made smaller without increasing the probability of a misalignment-type defect. It is well known that a narrower emitter can lead to smaller parasitic capacitance and hence substantially increase the switching speed of the bipolar transistor 118.

Figure 2:
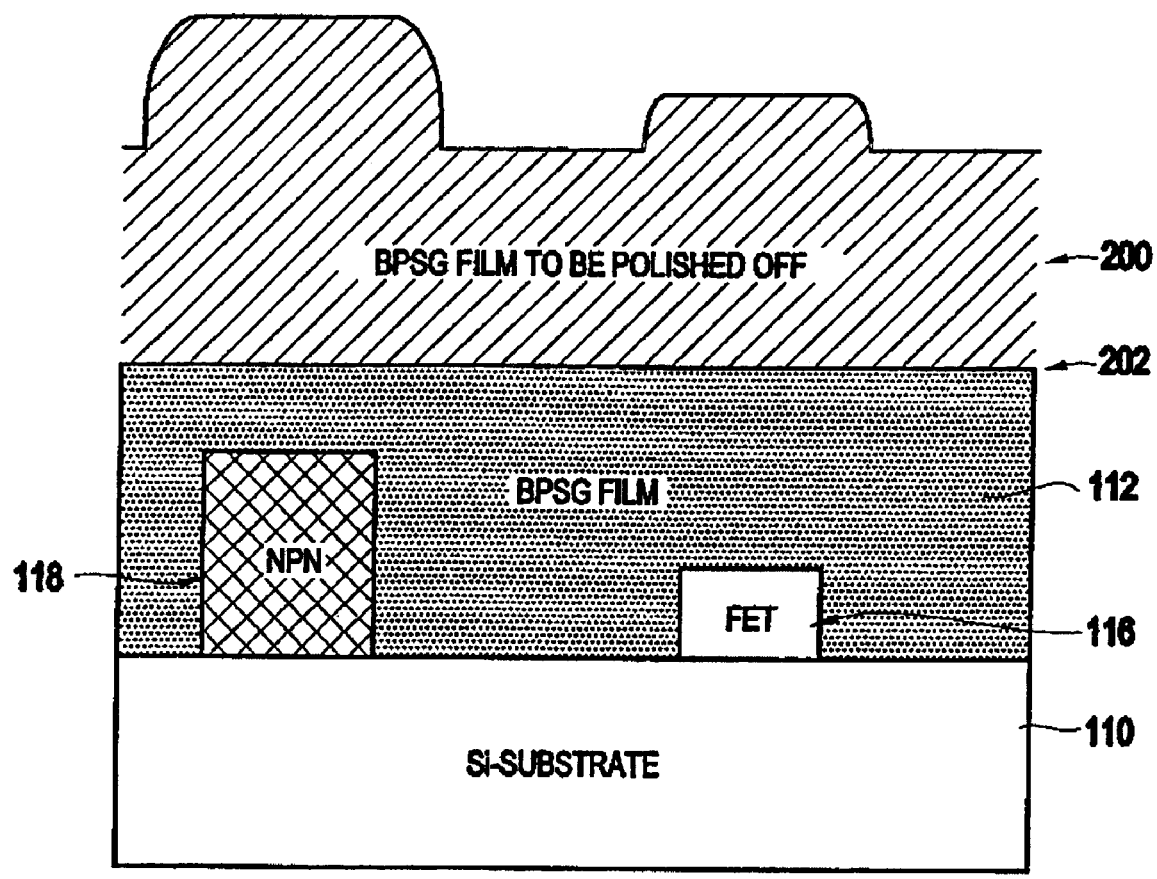
FIG. 2 is a schematic diagram of a partially completed structure.
Figure 3:
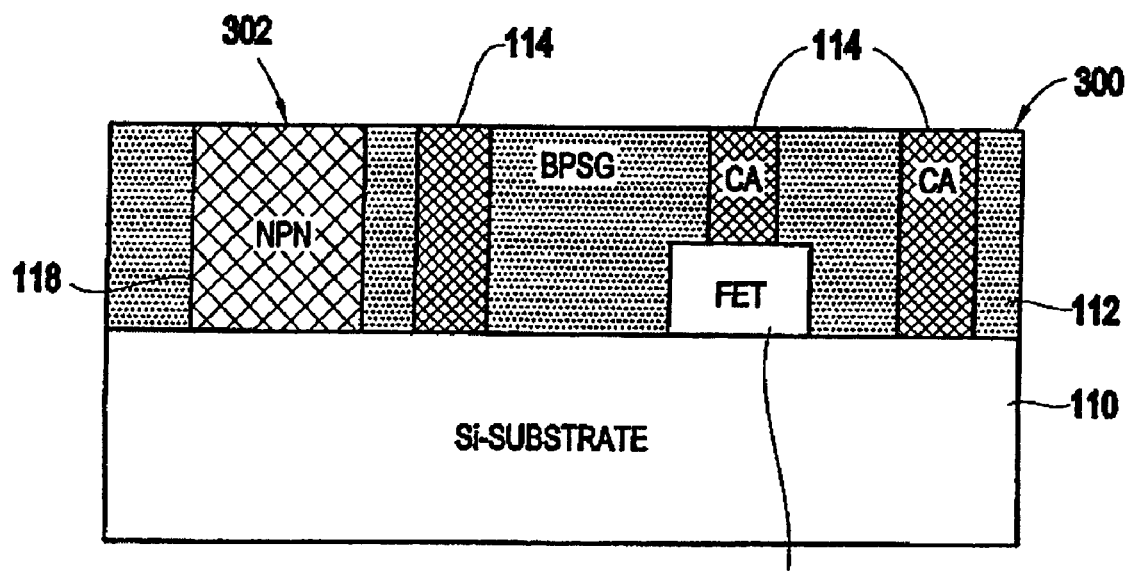
FIG. 3 is a schematic diagram of a partially completed structure.

FIGS. 2-5 illustrate processing steps leading up to the structure shown in FIG. 6. More specifically, FIG. 2 illustrates the structure just after the passivating layer 112 is formed. Conventional processes reduce the raw height of the passivating film 112 down to level 202, thereby removing a portion shown by arrow 200. This can be performed, for example, in a standard chemical mechanical polishing (CMP) process, or similar processing. However, as shown in FIG. 3, the invention reduces the height of the passivating layer 112 down to the level indicated by arrow 300 which is approximately equal to the top of the tallest device 302 (which, in this example, is the top of the vertical bipolar transistor 118). For example, the height of the passivating layer 112 could be reduced to within approximately (plus or minus) 50 nanometers of the top of the tallest device 118. To the contrary, FIG. 2 stops polishing at a much higher level (e.g., 400 nanometers) above the tallest devices.

FIG. 3 also illustrates the contacts 114 to the collector and based terminals of the critical bipolar device 118 and to the source, drain, and gate of the transistor 116 formed using standard damascene metal processing. For example, the contacts 114 can be formed from polysilicon, metal, alloy, etc. (e.g., tungsten). As explained above, the reduced height of the passivating layer 112 reduces the aspect ratio of the contacts 114, which dramatically decreases contact related defects (e.g., electrically open contacts, etc.). As a result, higher yields and more reliable contacts are produced with the invention.

Figure 4:
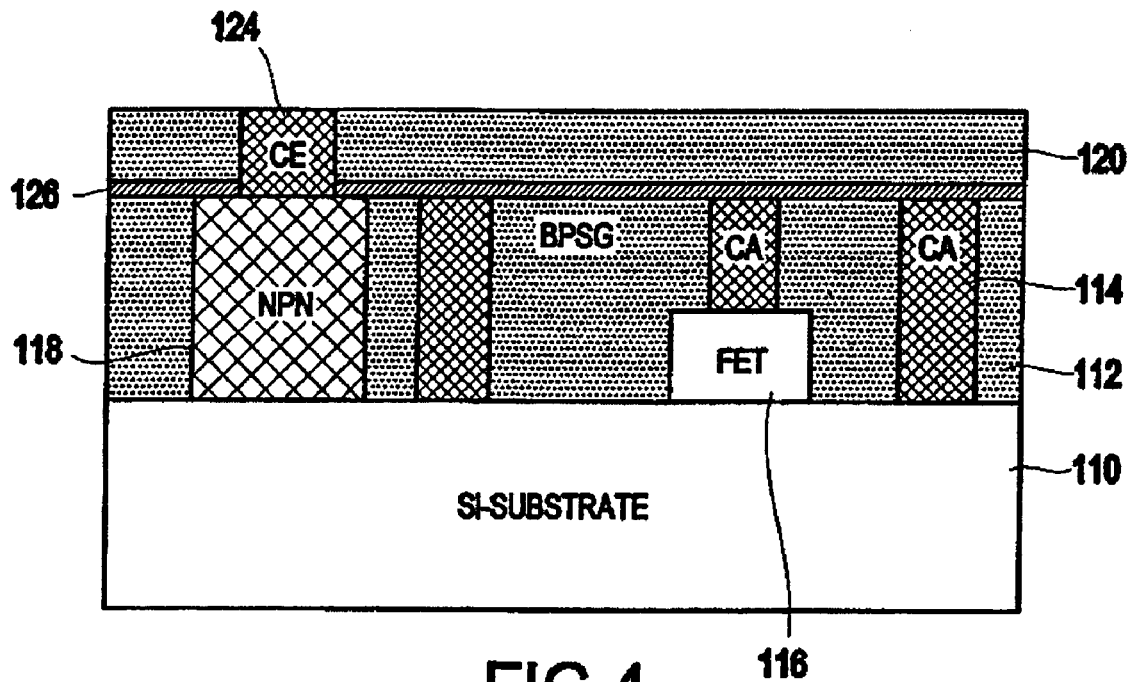
FIG. 4 is a schematic diagram of a partially completed structure.

As shown in FIG. 4, the invention optionally forms a dielectric 126 (e.g., silicon nitride, silicon carbide, etc.) and a lower dielectric constant material, undoped silicate oxide, etc. 120 as the insulating portion of the first wiring layer (M1). A dedicated photolithographic mask is used to pattern openings for the emitter contact 124 in the wiring layer 120. The emitter contact 124 comprises polysilicon, or a metal such as tungsten, etc. This processing allows the size and width of the emitter contact 124 to be independently controlled from all other processing. Because this mask is not shared, over-etching of the emitter is reduced. If the emitter contact and other deeper contacts are fabricated together with a shared mask, there is a significant over-etching of the emitter contact because the plasma etch reaches the bottom of emitter contact first and continues etching to open deeper contacts. By making the emitter contact wider, the width of emitter itself can be fabricated narrower. It is well known that narrower emitter can lead to smaller parasitic capacitance, and hence, substantially increase the switching speed of the bipolar transistor 118.

Figure 5:
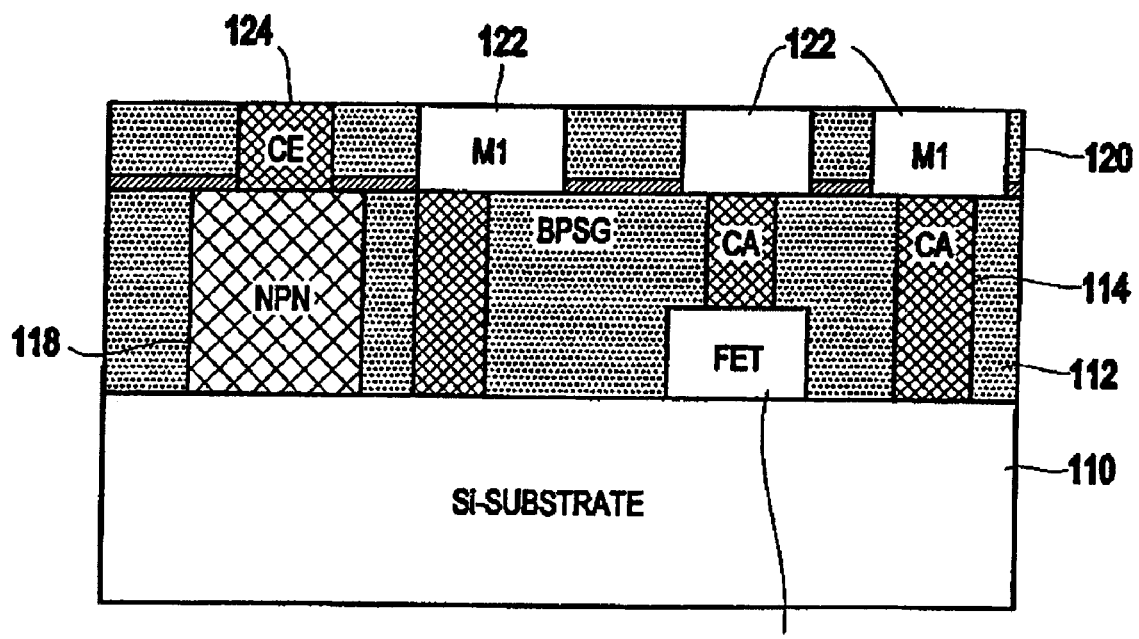
FIG. 5 is a schematic diagram of a partially completed structure.

As shown in FIG. 5, a separate mask is used to form openings in the insulator 120 in which wires 122 will be formed. The wiring material 122 is deposited in the openings and the excess is removed in a standard CMP process. Such wires 122 are generally metal, such as copper, aluminum, etc. Therefore, the emitter contact 124 can be made of a different material than the wires 122. Preferably, the emitter contact 124 is made of a material compatible with the CMP processing that will be performed on the wiring material 122.

This structure is completed as shown in FIG. 6 through the formation of the second wiring/via layer 132. More specifically, an additional insulator 128 similar to insulator 126 can be formed followed by a lower dielectric constant material 132. Multiple damascene processes are used to pattern openings and fill the openings with the vias 130 and wires 134 in a similar manner to that discussed with respect to wires 122.

Thus, the invention provides a method of forming different devices on a substrate. In the example shown above, the invention forms a plurality of complementary metal oxide semiconductor (CMOS) transistors 116 and vertical bipolar transistors 118 (only one of each is illustrated) on the substrate 110. Note that the vertical bipolar transistors 118 are taller than the CMOS transistors 116. The invention deposits a passivating layer 112 over the bipolar transistors 118 and the CMOS transistors 116 and then removes a portion of the passivating layer 112 so as to expose the vertical bipolar transistors 118 and leave the CMOS transistors 116 covered by the passivating layer 112. Next, the invention forms contacts 114 to the CMOS transistors 116 through the passivating layer 112 and forms a wiring layer 120 above the passivating layer 112 such that the wiring layer 120 is in direct contact with the vertical bipolar transistors 118.

Prior to forming the wiring layer 120, the invention can form emitter contacts 124 above the vertical bipolar transistors 118. These emitter contacts 124 are actually positioned within the wiring layer 120, but can be made of a different material than the wiring 122 within the wiring layer 120. The invention can also form a via layer 132 above the wiring layer 120. The emitter contacts 124 can extend through the wiring layer 120 to the via layer 132. This process also forms base and collector contacts 114 to the vertical bipolar transistors 118.

Figure 7:
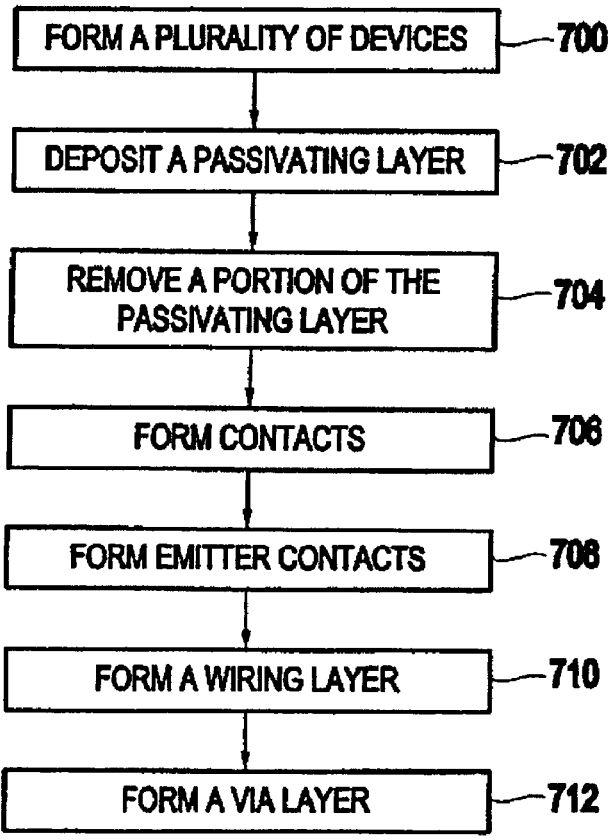
FIG. 7 is a flow diagram illustrating a preferred method of the invention.

FIG. 7 illustrates this processing in flowchart form. More specifically, in item 700, the invention forms a plurality of devices (e.g., complementary metal oxide semiconductor (CMOS) transistors and vertical bipolar transistors) on the substrate. The invention deposits a passivating layer 702 over the bipolar transistors and the CMOS transistors and then removes a portion of the passivating layer 704 down to the top of the vertical bipolar transistors. This leaves the CMOS transistors covered by the passivating layer. Next, the invention forms contacts 706 to the CMOS transistors through the passivating layer. The invention can form emitter contacts 708 above the vertical bipolar transistors and form a wiring layer 710 above the passivating layer such that the wiring layer is in direct contact with the vertical bipolar transistors. The invention can also form a via layer 712 above the wiring layer.

The invention polishes the BPSG very close to the top of bipolar device to decrease the contact opening aspect ratio and correspondingly decrease contact defect rates. The invention uses a wider emitter contact for the bipolar devices. Thus, the invention provides easier contact connection integration (more reliable contacts and better yield) and faster bipolar transistors with reduced lateral dimension (e.g., the width of the Bipolar device can be reduced due to less over-etching during emitter contact RIE etch).

While the invention has been described in terms of preferred embodiments, those skilled in the art will recognize that the invention can be practiced with modification within the spirit and scope of the appended claims.

What is claimed is:

1. An integrated circuit structure comprising:
   a substrate;
   a first type device and a second type device positioned on said substrate, said first type device having an uppermost surface that is higher than an uppermost surface of said second type device;
   a passivating layer positioned above said substrate and between said first and second type devices, wherein said passivating layer has a top surface substantially coplanar with said uppermost surface of said first type device;
   a wiring layer above said passivating layer comprising a first device contact embedded therein that is in electrical contact with said uppermost surface of said first type device;
   a second device contact embedded within said passivating layer and in electrical contact with said second type device; and
   a conductive wire feature embedded within said wiring layer, said conductive wire feature in electrical contact with said second device contact.

2. A method of forming the integrated structure in claim 1 comprising the steps of:
   providing a substrate;
   forming a first type device and a second type device positioned on said substrate, such that an uppermost surface of said first type device is higher than an uppermost surface of said second type device;
   forming a passivating layer positioned above said substrate and between said first and second type devices;
   removing an upper portion of said passivating layer to expose the uppermost surface of said first type device so that a top surface of said passivating layer has a height within approximately 50 nm of the uppermost surface of said first type device while leaving the second type device covered by said passivating layer;
   forming a second device contact embedded in said passivating layer, said second device contact having a top surface that is substantially coplanar with said top surface of said passivating layer, said second device contact being electrically connected to said second type device; and
   forming a wiring layer above said passivating layer, said wiring layer comprising an insulating layer;
   forming a first device contact embedded within said insulating layer of said wiring layer using a dedicated photolithographic mask; and
   forming wires within said insulating layer of said wiring layer using a separate photolithographic mask from said dedicated photolithographic mask.

3. The integrated circuit structure of claim 2, wherein said top surface of said passivating layer has a height within approximately 50 nm of the uppermost surface of said first type device.

4. The integrated circuit structure of claim 2, wherein said first type device is a bipolar transistor.

5. The integrated circuit structure of claim 4, wherein said first device contact is an emitter contact.

6. The integrated circuit structure of claim 5, wherein said emitter contact comprises a different material than said conductive wire feature.

7. The integrated circuit structure of claim 5, wherein said emitter contact comprises a material that is compatible with a chemical mechanical polishing process used on said conductive wire feature.

8. The integrated circuit structure of claim 2, wherein said second type device is a CMOS transistor.

* * * * *